United States Patent
Sandow et al.

(10) Patent No.: US 11,296,213 B2
(45) Date of Patent: Apr. 5, 2022

(54) REVERSE-CONDUCTING IGBT HAVING A REDUCED FORWARD RECOVERY VOLTAGE

(71) Applicant: Infineon Technologies Austria AG, Villach (AT)

(72) Inventors: Christian Philipp Sandow, Haar (DE); Wolfgang Roesner, Ottobrunn (DE); Matteo Dainese, Munich (DE)

(73) Assignee: Infineon Technologies Austria AG, Villach (AT)

( * ) Notice: Subject to any disclaimer, the term of this patent is extended or adjusted under 35 U.S.C. 154(b) by 91 days.

(21) Appl. No.: 16/825,122

(22) Filed: Mar. 20, 2020

(65) Prior Publication Data
US 2021/0296474 A1    Sep. 23, 2021

(51) Int. Cl.
*H01L 29/739* (2006.01)
*H01L 29/66* (2006.01)
*H01L 29/417* (2006.01)
*H01L 29/423* (2006.01)

(52) U.S. Cl.
CPC .... *H01L 29/7397* (2013.01); *H01L 29/41708* (2013.01); *H01L 29/4236* (2013.01); *H01L 29/66348* (2013.01)

(58) Field of Classification Search
CPC ........... H01L 29/7397; H01L 29/41708; H01L 29/4236; H01L 29/66348
USPC .......................................................... 257/139
See application file for complete search history.

(56) References Cited

U.S. PATENT DOCUMENTS

| | | | | |
|---|---|---|---|---|
| 2013/0240947 A1* | 9/2013 | Matsudai | ............ | H01L 29/7813 257/139 |
| 2015/0179636 A1* | 6/2015 | Pfirsch | .............. | H01L 29/66348 257/140 |
| 2016/0351561 A1* | 12/2016 | Senoo | ................. | H01L 27/0727 |
| 2017/0025410 A1* | 1/2017 | Cheng | ................. | H01L 27/0727 |
| 2018/0366548 A1* | 12/2018 | Naito | ...................... | H01L 29/78 |

* cited by examiner

*Primary Examiner* — Igwe U Anya
(74) *Attorney, Agent, or Firm* — Murphy, Bilak & Homiller, PLLC

(57) ABSTRACT

According to an embodiment of a power semiconductor device, the device includes: a semiconductor substrate including an IGBT region having an IGBT and a diode region having a diode. The IGBT region includes a plurality of first trenches extending perpendicular to a first main surface of the semiconductor substrate. The diode region includes a plurality of second trenches extending perpendicular to the first main surface of the semiconductor substrate. An average lateral spacing between adjacent ones of the second trenches is greater than an average lateral spacing between adjacent ones of the first trenches. Additional power semiconductor device embodiments are described herein, as are corresponding methods of production.

29 Claims, 5 Drawing Sheets

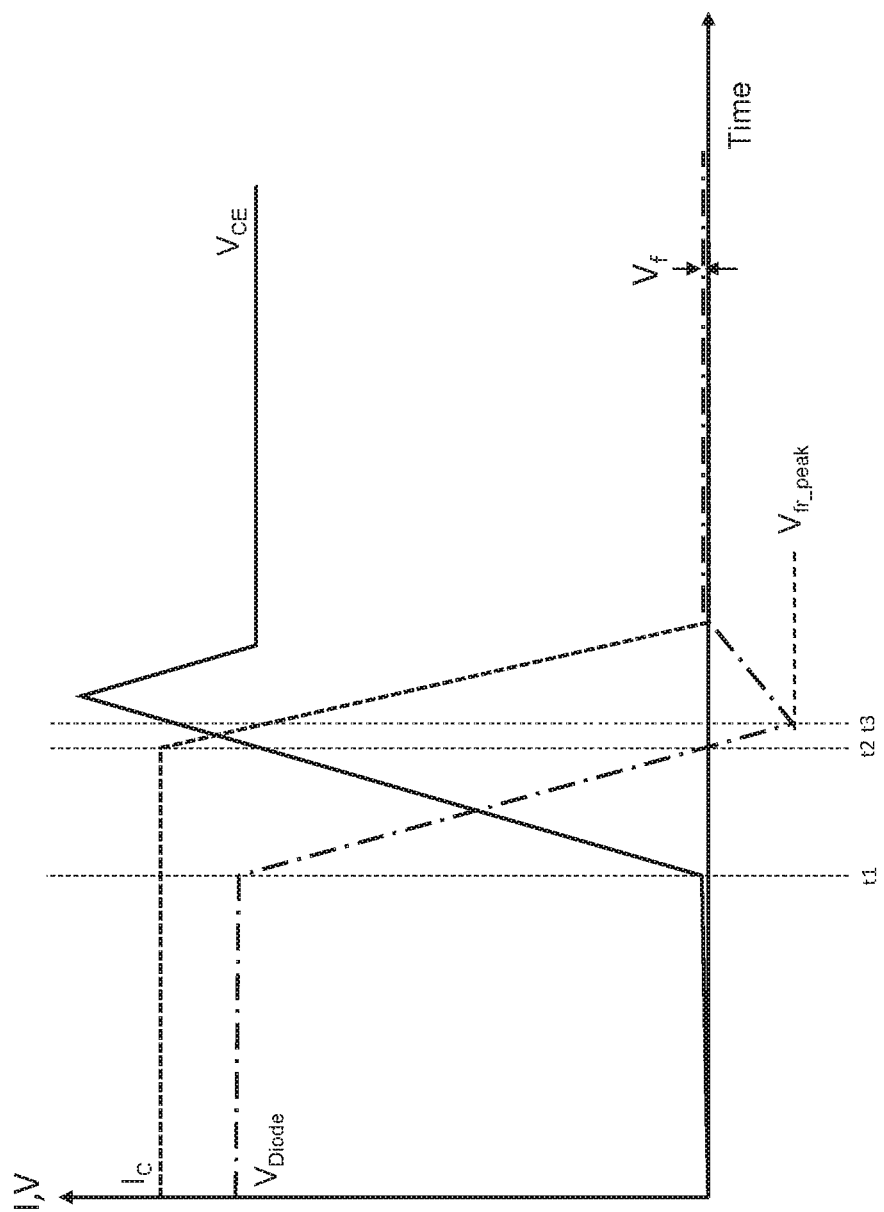

REVERSE-CONDUCTING IGBT HAVING A REDUCED FORWARD RECOVERY VOLTAGE

BACKGROUND

Reverse-conducting insulated-gate bipolar transistors (RC-IGBTs) integrate an IGBT and a freewheeling diode on a single chip (die). Many IGBT applications have a mode in which freewheeling current flows from the emitter to the collector. For such a freewheeling operation, the freewheeling diode is connected anti-parallel to the IGBT.

An IGBT-like trench-patterning process may be used at the anode of the integrated diode to provide improved diode switching ruggedness. The resulting trench electrodes formed in the diode region shield the anode of the integrated diode from high electric fields which avoids punch through and therefore provides switching ruggedness. RC-IGBTs with sufficiently high switching ruggedness may be used in applications which employ hard switching. With hard switching, both voltage and current are applied to an IGBT during on-off transitions. Hence, collector current and collector-emitter voltage change sharply when hard switching an IGBT.

However, increasing IGBT switching ruggedness typically leads to a higher forward-recovery voltage (Vfr) for the integrated diode. When the IGBT is conducting, the diode is blocking. As the IGBT starts to turn off and switching current of the IGBT begins commutating into the diode, the collector-emitter voltage of IGBT begins to increase and the diode voltage conversely begins to drop. As current continues to commutate into the diode, an undershoot of the diode voltage occurs. This undershoot is commonly referred to as the forward-recovery voltage (Vfr) of the diode. The peak of the forward-recovery voltage Vfr can be significant. For example, a Vfr of about 300V is not uncommon for a 1200V technology. Such a Vfr can interfere with the operation of the neighboring IGBT and damage gate driver circuitry for the IGBT.

The diode of an RC-IGBT may include trench electrodes formed in the semiconductor substrate to enhance switching ruggedness, as explained above. Eliminating the trench electrodes from the diode region of the RC-IGBT device strongly reduces the diode Vfr. In diodes without trench electrodes, a reduction of anode efficiency, which is a preferred measure to increase diode performance, is limited by decreasing the switching ruggedness. That is, a diode anode region which is highly doped provides sufficient switching ruggedness but is highly efficient and increases switching losses. Therefore, an RC-IGBT device without trench electrodes and having an anode region doped to minimize switching losses can be used in soft-switching applications where anode efficiency may be relatively large. However, in hard-switching applications, the use of trench electrodes in the diode region is preferred because of the required switching ruggedness.

Hence, there is a tradeoff between anode efficiency and switching ruggedness. If the anode region is highly doped, trench electrodes are not necessary because the highly doped anode provides adequate switching ruggedness but at the expense of increased switching losses. A lower doped anode region has lower efficiency which is good for reducing switching losses but reduces switching ruggedness which is problematic for applications which use hard switching.

Thus, there is a need for an improved RC-IGBT having low anode efficiency and high switching ruggedness.

SUMMARY

According to an embodiment of a power semiconductor device, the power semiconductor device comprises: a semiconductor substrate comprising an IGBT (insulated gate bipolar transistor) region comprising an IGBT and a diode region comprising a diode, the IGBT region having in a top view a first area and the diode region having in the top view a second area, wherein the IGBT region comprises a plurality of first trenches comprising first trench electrodes and extending perpendicular to a first main surface of the semiconductor substrate, wherein the diode region comprises a plurality of second trenches having second trench electrodes and extending perpendicular to the first main surface of the semiconductor substrate, wherein the plurality of first trenches provides a first capacitance between the first trench electrodes and the semiconductor substrate in the IGBT region and the plurality of second trenches provides a second capacitance between the second trench electrodes and the semiconductor substrate in the diode region, wherein a capacitance density of the second capacitance per the second area is smaller than a capacitance density of the first capacitance per the first area.

According to another embodiment of a power semiconductor device, the power semiconductor device comprises: a semiconductor substrate comprising an IGBT region having an IGBT and a diode region having a diode, wherein the IGBT region comprises a plurality of first trenches extending perpendicular to a first main surface of the semiconductor substrate, wherein the diode region comprises a plurality of second trenches extending perpendicular to the first main surface of the semiconductor substrate, wherein an average lateral spacing between adjacent ones of the second trenches is greater than an average lateral spacing between adjacent ones of the first trenches.

According to an embodiment of a method of producing a power semiconductor device, the method comprises: forming an IGBT in an IGBT region of a semiconductor substrate, the IGBT region having in a top view a first area; and forming a diode in a diode region of the semiconductor substrate, the diode region having in a top view a second area, wherein forming the IGBT comprises forming a plurality of first trenches having first trench electrodes and extending perpendicular to a first main surface of the semiconductor substrate in the IGBT region, wherein forming the diode comprises forming a plurality of second trenches having second trench electrodes which extend perpendicular to the first main surface of the semiconductor substrate in the diode region, such that a capacitance density of a capacitance provided between the plurality of second trenches and the semiconductor substrate per the second area is less than a capacitance density of a capacitance provided between the plurality of first trenches and the semiconductor substrate per the first area.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3 illustrates voltage (V) and current (I) waveforms for the RC-IGBT, when the IGBT transitions from an on-state to an off-state and the diode transitions from a blocking state to a freewheeling (conducting) state.

DETAILED DESCRIPTION

Described herein is an RC-IGBT having low anode efficiency and high switching ruggedness, and corresponding methods of production. Several embodiments described herein achieve high switching ruggedness without unduly increasing anode efficiency. For further adjustment of anode efficiency and switching ruggedness, the anode contact area of the integrated diode may be tailored also as described herein. It is to be understood that the features of the various embodiments described herein may be combined with each other, unless specifically noted otherwise.

Figure 1:
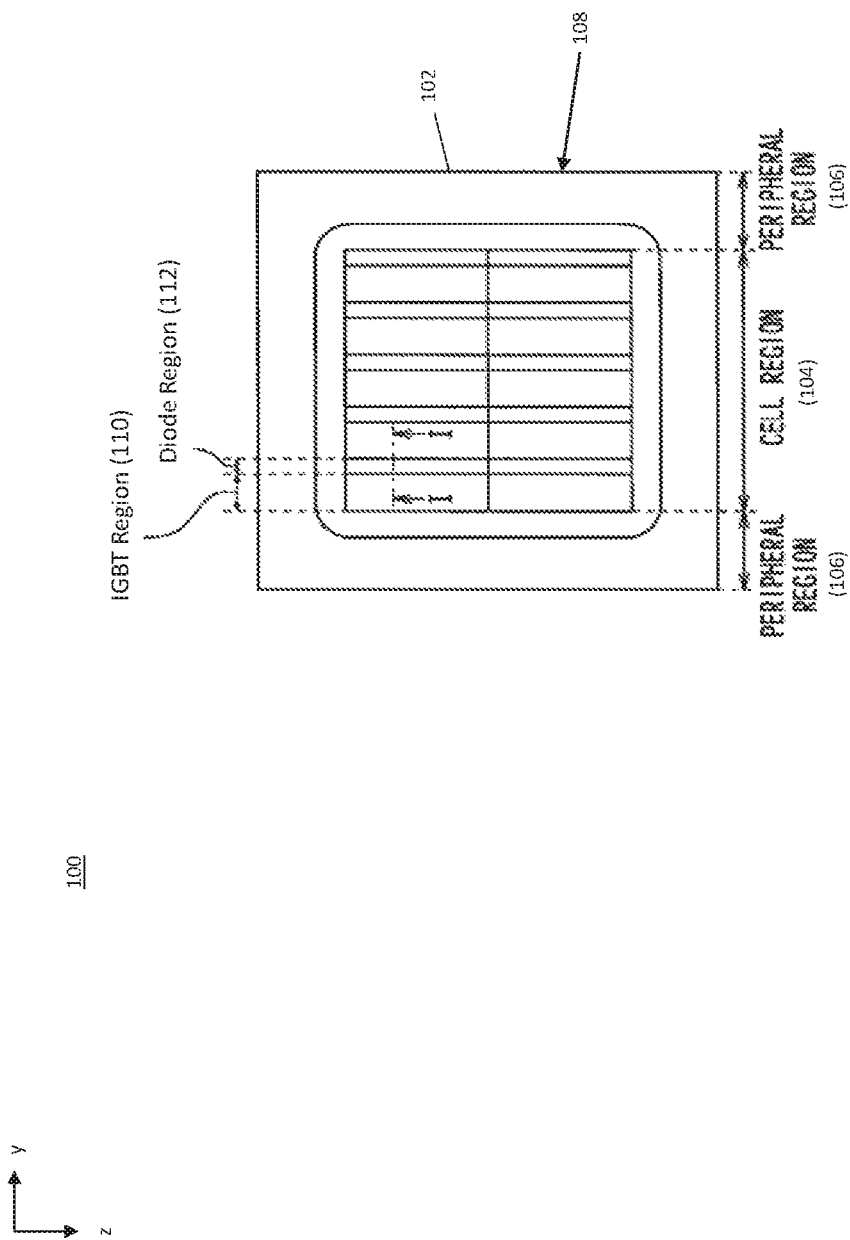
FIG. 1 illustrates a top plan view of a power semiconductor device that includes an RC-IGBT (reverse-conducting IGBT).

FIG. 1 illustrates a top plan view of a power semiconductor device 100. The power semiconductor device 100 includes a semiconductor substrate 102. The semiconductor substrate 102 may include one or more of a variety of semiconductor materials that are used to form integrated circuit devices, such as but not limited to silicon (Si), silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material.

The power semiconductor device 100 includes a cell region 104 in which an RC-IGBT is formed, and a peripheral region 106 which laterally surrounds the cell region 104 and electrically isolates the RC-IGBT from the edge 108 of the semiconductor substrate 102. Within the cell region 104, the semiconductor substrate 102 includes an IGBT region 110 comprising an IGBT and a diode region 112 comprising a diode. The IGBT region 110 and the diode region 112 are shown with stripe layouts in FIG. 1. In this example, IGBT and diode cells are interleaved with one another in a stripe-like manner. This arrangement allows for a more homogenous distribution of heat generated primarily in the diode region 112 and therefore a more efficient cooling. Each of the IGBT stripes may include a plurality of trenches, e.g. at least 2, at least 5 or at least 10 trenches forming a respective IGBT cell. Each IGBT cell includes at least one trench configured to control the IGBT current. In some embodiments, each IGBT cell may include trenches connected to emitter potential and trenches connected to gate potential as will be described below in more detail. In some embodiments, the trenches connected to emitter potential may be interleaved with the trenches connected to gate potential. Each of the diode cells includes a plurality of trenches, e.g. at least 2, at least 5 or at least 10 trenches. In one embodiment, the plurality of trenches may include trenches connected to a same potential, e.g. emitter potential. However, this is just an example and other arrangements are possible. In some embodiments, each IGBT stripe may comprise a plurality of IGBT cells and each diode stripe may include a plurality of diode cells. The IGBT region 110 and the diode region 112 may each have any desired layout. In one embodiment, the diode areas are embedded in the IGBT. The IGBT region 110 may adjoin an edge termination structure formed in the peripheral region 106.

Figure 2B:
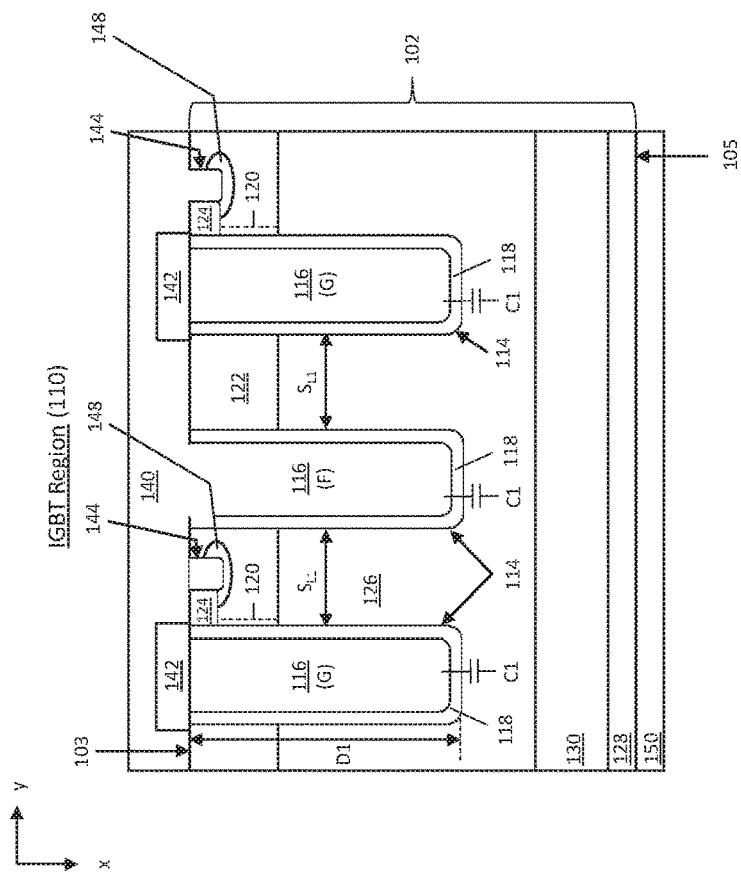
FIG. 2B Illustrates a cross-sectional view of part of an IGBT region of the RC-IGBT, also taken along the line labelled I-I in FIG. 1.
Figure 2A:
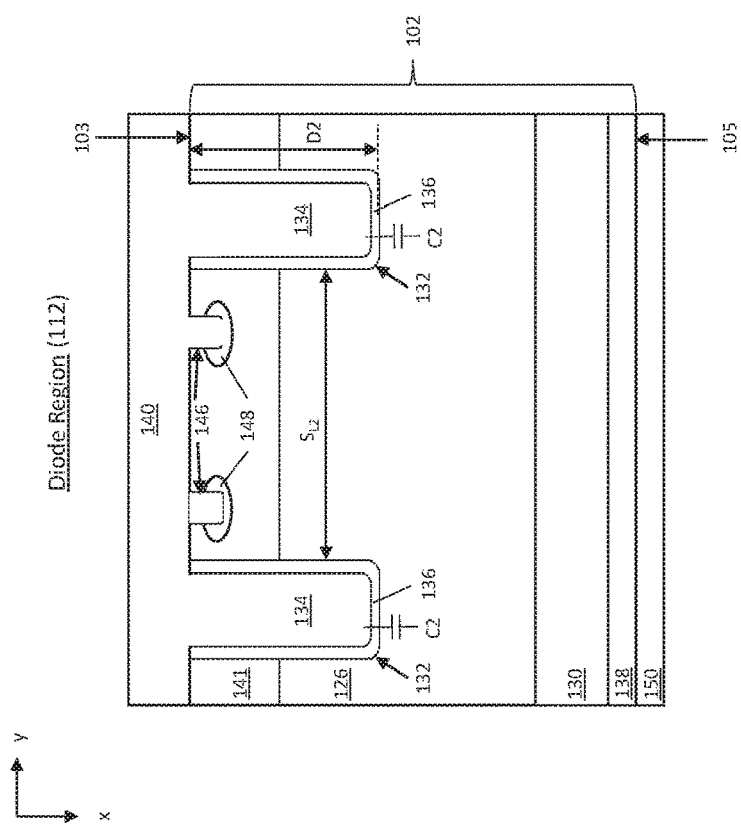
FIG. 2A Illustrates a cross-sectional view of part of a diode region of the RC-IGBT, taken along the line labelled I-I in FIG. 1.

FIG. 2A Illustrates a cross-sectional view of a part of the diode region 112 taken along the line labelled I-I in FIG. 1. FIG. 2B Illustrates a cross-sectional view of part of the IGBT region 110 also taken along the line labelled I-I in FIG. 1.

In the top plan view of FIG. 1, the IGBT region 110 has a first area and the diode region 112 has a second area. Based on the stripe layout shown in FIG. 1, the first area occupied by the IGBT region 110 is discontinuous and includes the area of each IGBT stripe. The second area occupied by the diode region 112 also is discontinuous and similarly includes the area of each diode stripe. Thus, the IGBT region 110 may be a combination of multiple discontinuous IGBT sub-areas (e.g. stripes) to form the IGBT region 110 and the diode region 112 also may be considered as a combination of multiple discontinuous diode sub-areas (e.g. stripes) to form the diode region 112. In other words, the first area occupied by the IGBT region 110 is an overall area of all IGBT subregions and the second area occupied by the diode region 112 is an overall area of all diode subregions. For stripe-like arranged first trenches 114, the first area may be calculated by summing the top view area of the first trenches 114 and the top view area of the mesa portions formed between the first trenches 114. The discontinuous arrangement of the first (IGBT) area and the second (diode) area in FIG. 1 arises due to the IGBT 'stripes' interleaved with the diode 'stripes'. The first area occupied by the IGBT region 110 and the second area occupied by the diode region 112 instead may each be continuous, respectively. For example, the IGBT region 110 may be uninterrupted by the diode region 112 and formed adjacent to the diode region 112 in the semiconductor substrate 102.

The IGBT region 110 includes first trenches 114 having first trench electrodes 116 insulated from the surrounding semiconductor substrate 102 by a first insulating layer 118. The first trenches 114 of the IGBT region 110 extend perpendicular (direction 'x' in FIG. 2B) to a first main surface 103 of the semiconductor substrate 102. In some embodiments, the number of first trenches formed in the first area may be 100 or more, 500 or more or 1000 or more. In some embodiments, the number of second trenches formed in the second area may be 100 or more, 500 or more or 1000 or more.

Some of the first trench electrodes 116 are gate (G) electrodes for controlling a conductive channel 120 in a body region 122 of the IGBT. Other ones of the first trench electrodes 116 are field (F) electrodes for shaping the electric field potential within the semiconductor substrate 102 during controlling operation of the RC-IGBT. The field electrodes F may be electrically connected to a different potential than the gate electrodes G. For example, the field electrodes F may be electrically connected to emitter potential, ground, or may be electrically floating.

The body region 122 separates emitter regions 124 of the IGBT from a drift region 126. The emitter regions 124 are electrically connected to the drift region 126 when the conductive channel 120 is present. The conductive channels 120 are controlled by the voltage applied to the gate electrodes G of the IGBT.

The IGBT also includes a collector region 128 at the opposite surface 105 of the semiconductor substrate 102 as the emitter regions 124. The emitter regions 124, the drift region 126 and the conductive channels 120 are of a first conductivity type, and the body region 122 and the collector region 128 are of a second conductivity type opposite the first conductivity type. For example, in the case of an n-type conductive channel 120, the emitter regions 124 and the drift region 126 are n-type and the body region 122 and the collector region 128 are p-type. Conversely, in the case of a p-type conductive channel 120, the emitter regions 124 and the drift region 126 are p-type and the body region 122 and the collector region 128 are n-type. An optional field stop region 130 of the first conductivity type may be formed in the semiconductor substrate 102 between the drift region 126 and the collector region 128. The field stop region 130 may be omitted in the diode region 112 even if provided in the IGBT region 110. In some embodiments, the field stop region 130 in the diode region 112 and the IGBT region 110 may have different doping concentrations, different doping profiles or different thicknesses or a combination thereof.

The diode region 112 of the power semiconductor device 100 includes second trenches 132 having second trench electrodes 134 insulated from the surrounding semiconductor substrate 102 by a second insulating layer 136. The second trenches 132 of the diode region 112 extend perpendicular (direction 'x' in FIG. 2A) to the first main surface 103 of the semiconductor substrate 102. For stripe-like arranged trenches 132, the second area of the diode region 112 can be calculated by summing the top view area of the second trenches 132 and the top view area of the mesa portions formed between the second trenches 132.

The cell construction of the diode region 112 may be similar to that of the IGBT region 110. Different, however, the emitter regions 124 are omitted from the diode region 112. Also, the diode region 112 has a cathode region 138 of the first conductivity type instead of the collector region 128 of the second conductivity type at the second main surface 105 of the semiconductor substrate 102. At the first main surface 103 of the semiconductor substrate 102, a first metallization 140 may be electrically connected to the body region 122, the emitter regions 124 and the field electrodes F in the IGBT region 110 and to the second trench electrodes 134 and the anode region 141 in the diode region 112. The gate electrodes G of the IGBT region 110 are insulated from the first metallization 140 by an insulating material 142 such as a dielectric.

The electrical connections to the first metallization 140 may be formed by first contact trenches 144 which extend perpendicular (direction 'x' in FIG. 2B) to the first main surface 103 of the semiconductor substrate 102 in the IGBT region 110 and by second contact trenches 146 which also extend perpendicular (direction 'x' in FIG. 2A) to the first main surface 103 of the semiconductor substrate 102 in the diode region 112. In the IGBT region 110, the first metallization 140 is electrically connected to the body region 122, the emitter regions 124 and the field electrodes F of the IGBT through the first contact trenches 144. In the diode region 112, the first metallization 140 is electrically connected to the second trench electrodes 134 and the anode region 141 of the diode through the second contact trenches 146. The semiconductor substrate 102 may include a highly doped region 148 of the second conductivity type which adjoins the bottom and at least part of the sidewalls of the first and second contact trenches 144, 146.

According to one embodiment, the doping concentration of the semiconductor substrate 102 via the highly doped region 148 at the sidewall of at least the second contact trenches 146 in the diode region 112 is lower than the doping concentration of the semiconductor substrate 102 at the bottom of the second contact trenches 146. Such a doping variation for the semiconductor substrate 102 may be implemented by controlling the doping profile of the highly doped region 148 accordingly.

A higher doping concentration at the bottom of the second contact trenches 146 in the diode region 112 provides for good Ohmic contact with the first metallization 140 whereas lower doping along the sidewalls reduces anode efficiency which is good for lower switching losses.

A second metallization 150 contacts the collector region 128 of the IGBT and the cathode region 138 of the diode at the second main surface 105 of the semiconductor substrate 102.

FIG. 3 illustrates voltage (V) and current (I) waveforms for the RC-IGBT, when the IGBT transitions from an on-state to an off-state and the diode transitions from a blocking state to a freewheeling (conducting) state. Before time t1 the collector-emitter voltage $V_{CE}$ of the IGBT is at or near zero volts and the diode is in a blocking state during which the diode voltage $V_{Diode}$ is at a peak blocking level. As the IGBT begins to turn off at time t1 the collector-emitter voltage $V_{CE}$ of the IGBT begins to rise and the diode voltage $V_{Diode}$ begins to drop. At time t2, the collector current $I_C$ of the IGBT begins to drop and the diode voltage $V_{Diode}$ begins to undershoot. The undershoot in the diode voltage $V_{Diode}$ which occurs during turn-off of the IGBT is commonly referred to as forward-recovery voltage ($V_{fr}$) of the diode. The forward-recovery voltage $V_{fr}$ of the diode reaches a peak value $V_{fr\_peak}$ at time t3, at which point the undershoot begins to decrease. Eventually the diode voltage $V_{Diode}$ reaches the forward voltage $V_f$ of the diode and the diode becomes forward biased. Freewheeling current flows through the diode when the diode is forward biased and the IGBT is off.

The MOS (metal-oxide-semiconductor) interface with every trench 114, 132 of the RC-IGBT has some capacitance. More particularly, the first trenches 114 in the IGBT region 110 provide a first capacitance C1 between the first trench electrodes 116 and the semiconductor substrate 102 in the IGBT region 110. The second trenches 132 in the diode region 112 likewise provide a second capacitance C2 between the second trench electrodes 134 and the semiconductor substrate 102 in the diode region 112. As used herein, the capacitance is calculated by C=kεA/d where k is a constant, ε is the permittivity of the respective insulating layer 118, 136 insulating the IGBT trenches 114 or the diode trenches 132, respectively, from the semiconductor substrate 102, A is the respective area of the capacitance, and d is the average thickness of the respective insulating layers 118, 136. The area A of a respective capacitance can be calculated by the surface area of the respective trench 114/132 facing on one side the semiconductor substrate 102 and on the other side (via the insulating layer 118/136) the respective electrode 116/134 within the trench 114/132 from the semiconductor substrate 102.

To ensure that the RC-IGBT has both low anode efficiency and high switching ruggedness, the capacitance density of the second capacitance C2 per the second area of the diode region 112 may be smaller than the capacitance density of the first capacitance C1 per the first area of the IGBT region 110. In other words, the ratio of C2 over F2 is smaller than the ratio of C1 over F1, where C2 is the overall capacitance in the diode region 112, F2 is the second area of the diode region, C1 is the overall capacitance in the IGBT region 110 and F1 is the first area of the IGBT region 110. Reducing the capacitance density of the diode region 112 relative to the capacitance density of the IGBT region 110 allows to reduce the undershoot in the diode forward-recovery voltage $V_{fr}$. However, to support hard switching applications, the diode region 112 is still provided with the second trench electrodes 132.

In one embodiment, the capacitance density of the second capacitance C2 per the second area of the diode region 112 is 1.5 times to 10 times less than the capacitance density of the first capacitance C1 per the first area of the IGBT region 110. In another embodiment, the capacitance density of the second capacitance C2 per the second area of the diode region 112 is 1.5 times to 4 times less than the capacitance density of the first capacitance C1 per the first area of the IGBT region 110. In some embodiments, the capacitance density of the second capacitance C2 per the second area of the diode region 112 is 1.8 times to 3 times less than the capacitance density of the first capacitance C1 per the first area of the IGBT region 110.

The capacitance density of the second capacitance C2 per the second area of the diode region 112 may be made smaller than the capacitance density of the first capacitance C1 per the first area of the IGBT region 110 by terminating the second trenches 132 in the diode region 112 shallower in the semiconductor substrate 102 than the first trenches 114 in the IGBT region 110, e.g., as shown in FIGS. 2A and 2B. According to this embodiment, the first trenches 114 in the IGBT region 110 extend to a first depth D1 in the semiconductor substrate 102 as measured from the first main surface 103 of the semiconductor substrate 102 and the second trenches 132 in the diode region 112 extend to a second depth D2 in the semiconductor substrate 102, the second depth D2 being less than the first depth D1 (i.e. D2<D1).

Separately or in addition, the capacitance density of the second capacitance C2 per the second area of the diode region 112 may be made smaller than the capacitance density of the first capacitance C1 per the first area of the IGBT region 110 by forming fewer second trenches 132 per unit area in the diode region 112 than there are first trenches 114 per unit area in the IGBT region 110, and/or by spacing the second trenches 132 further apart in the diode region 112 than the first trenches 114 are spaced apart in the IGBT region 110, e.g., as shown in FIGS. 2A and 2B. According to this embodiment, an average lateral spacing $S_{L2}$ between adjacent ones of the second trenches 132 in the diode region 112 is greater than an average lateral spacing $S_{L1}$ between adjacent ones of the first trenches 114 in the IGBT region 110 (i.e. $S_{L2} > S_{L1}$). In one embodiment, the average lateral spacing $S_{L2}$ between adjacent ones of the second trenches 132 in the diode region 112 is 1.5 times to 30 times greater than the average lateral spacing $S_{L1}$ between adjacent ones of the first trenches 114 in the IGBT region 110. In another embodiment, the average lateral spacing $S_{L2}$ between adjacent ones of the second trenches 132 in the diode region 112 is 1.5 times to 10 times greater than the average lateral spacing $S_{L1}$ between adjacent ones of the first trenches 114 in the IGBT region 110. In another embodiment, the average lateral spacing $S_{L2}$ between adjacent ones of the second trenches 132 in the diode region 112 is greater than 0.3 µm and less than 20 µm and the average lateral spacing $S_{L1}$ between adjacent ones of the first trenches 114 in the IGBT region 110 is 0.6 µm or less.

Separately or in addition, the capacitance density of the second capacitance C2 per the second area of the diode region 112 may be made smaller than the capacitance density of the first capacitance C1 per the first area of the IGBT region 110 by separating the second trenches 132 in the diode region 112 along a direction of the lengthwise extension of the trenches 132 (z-axis). Instead of having continuous trenches 132 extending substantially from one end of the diode region 112 to the other end, each second trench 132 in the diode region 112 may be segmented into multiple trench portions which are formed along a direction of the lengthwise extension of the second trenches 132. Adjacent trench portions of the same second trench 132 in the diode region 112 are separated from one another by a substrate area of the semiconductor substrate 102.

Separately or in addition, the capacitance density of the second capacitance C2 per the second area of the diode region 112 may be made smaller than the capacitance density of the first capacitance C1 per the first area of the IGBT region 110 by making the insulating layer 136 which separates the second trench electrodes 134 from the semiconductor substrate 102 in the diode region 112 thicker than the insulating layer 118 which separates the first trench electrodes 116 and the semiconductor substrate 102 in the IGBT region 110.

Separately or in addition, the capacitance density of the second capacitance C2 per the second area of the diode region 112 may be made smaller than the capacitance density of the first capacitance C1 per the first area of the IGBT region 110 by selecting the permittivity (ε) of the insulating layer which separates the second trench electrodes 134 from the semiconductor substrate 102 in the diode region 112 to be smaller than the permittivity of the insulating layer 118 which separates the first trench electrodes 116 and the semiconductor substrate 102 in the IGBT region 110. For example, the insulating layer 136 lining the sidewalls and bottom of the second trenches 132 in the diode region 112 may be a low-k dielectric material such as fluorine-doped silicon dioxide, carbon-doped oxide, porous silicon dioxide, etc. and the insulating layer 118 lining the sidewalls and bottom of the first trenches 114 in the IGBT region 110 may be silicon dioxide formed by thermal oxidation.

In addition to one, some or all of the embodiments described herein for making the capacitance density of the second capacitance C2 per the second area of the diode region 112 smaller than the capacitance density of the first capacitance C1 per the first area of the IGBT region 110, the average density of the side wall area of the second contact trenches 146 between adjacent second trenches 132 in the diode region 112 may be greater than the average density of the side wall area of the first contact trenches 144 between adjacent first trenches 114 in the IGBT region 110. The side wall area of each contact trench 144, 146 is the surface area occupied by the sidewalls of that contact trench 144, 146. Separately or in combination, the average density of the side wall area of the second contact trenches 146 per the second area of the diode region 112 may be greater than the average density of the side wall area of the first contact trenches 114 per the first area of the IGBT region 110.

By occupying the resulting wider anode region 122 in the diode region 112 with additional contact trenches 146, the current density is lowered at the contact points with the first metallization 140. This results in a smaller anode efficiency but with improved switching ruggedness.

FIGS. 2A and 2B illustrate an embodiment in which two (2) second contact trenches 146 are disposed between adjacent second trenches 132 in the diode region 112 and a single (1) first contact trench 144 is disposed between adjacent first trenches 114 in the IGBT region 110. Increasing the number of second contact trenches 146 disposed between adjacent second trenches 132 in the diode region 112 provides more paths for carriers to exit the diode and lowers anode efficiency which reduces switching losses.

Figure 4:
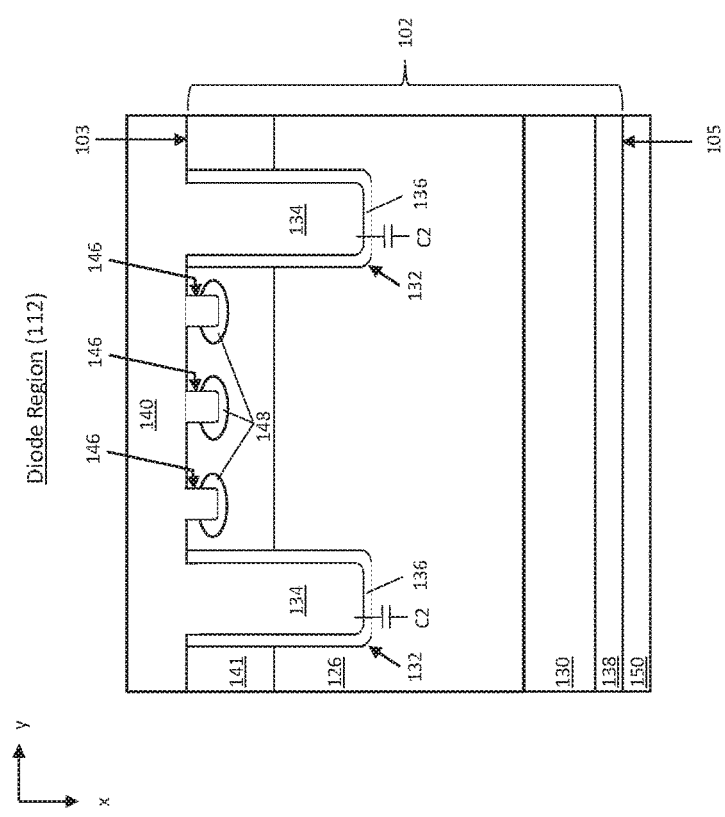

FIG. 4 illustrates an embodiment in which three (3) second contact trenches 146 are disposed between adjacent second trenches 132 in the diode region 112. A single (1) first contact trench 144 may be disposed between adjacent first trenches 114 in the IGBT region 110, e.g., as shown in FIG. 2B.

Figure 5:
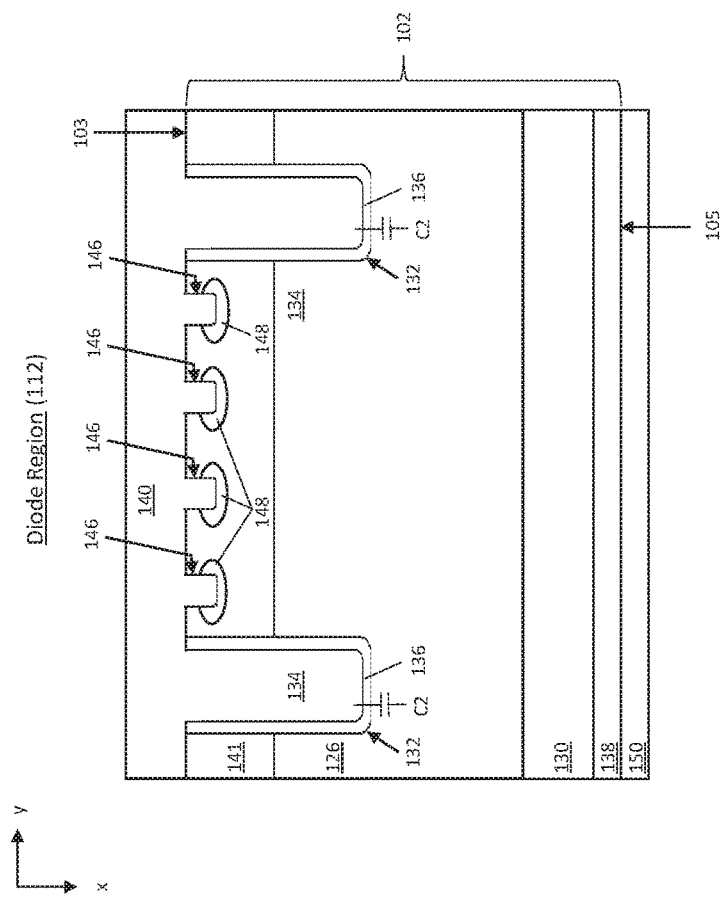
FIGS. 4 through 6 illustrate respective cross-sectional views of different contact trench embodiments for the diode region of the RC-IGBT.

FIG. 5 illustrates an embodiment in which four (4) second contact trenches 146 are disposed between adjacent second trenches 132 in the diode region 112. A single (1) first contact trench 144 may be disposed between adjacent first trenches 114 in the IGBT region 110, e.g., as shown in FIG. 2B. In yet additional embodiments, more than four (>4) second contact trenches 146 may be disposed between adjacent second trenches 132 in the diode region 112.

In an embodiment, the respective second contact trenches 146 are connected at predefined locations by one or more crossing contact trenches extending in a direction perpendicular to the lengthwise extension of the second contact trenches 146. In some embodiments, the crossing contact trenches may extend having an oblique angle with respect to the second contact trenches 146. The forming of the crossing contact trenches may lead to a grid-like or mesh-like contact trench arrangement in a top plan view. The grid-like or mesh-like contact trench arrangement may maximize the contact area at equal critical dimension. The grid-like or mesh-like contact trench arrangement may also increase the area of the anode region formed by the highly doped region 148 of the second conductivity type which adjoins the bottom and at least part of the sidewalls of the second contact trenches 146. The grid-like or mesh-like contact trench arrangement may also increase the length of the circumference of the second contact trenches 132 and therefore the sidewall density to obtain improved performance during the ON state.

Figure 6:
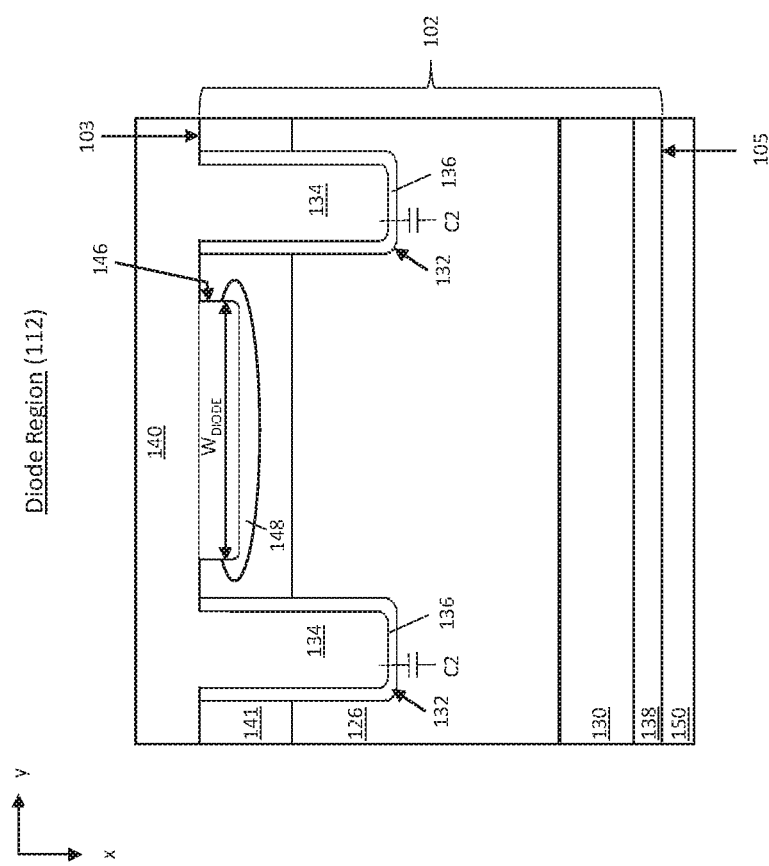

FIG. 6 illustrates an embodiment in which a single (1) second contact trench 146 is disposed between adjacent second trenches 132 in the diode region 112. A single (1) first contact trench 144 similarly may be disposed between adjacent first trenches 114 in the IGBT region 110, as shown in FIG. 2B. According to the embodiment illustrated in FIG. 6, the second contact trenches 146 in the diode region 112 have an average width $W_{DIODE}$ which is greater than an average width of the first contact trenches 144 in the IGBT region 110. For example, the average width $W_{DIODE}$ of second contact trenches 146 in the diode region 112 may range from 100 nm up to the full anode region 141 between adjacent second trenches 132. Providing a single (1) but relatively wide contact 146 between adjacent second trenches 132 in the diode region 112 provides higher anode efficiency with similar switching ruggedness as compared to the multi-contact embodiments illustrated in FIGS. 2A, 4 and 5.

Although the present disclosure is not so limited, the following numbered examples demonstrate one or more aspects of the disclosure.

Example 1

A power semiconductor device, comprising: a semiconductor substrate comprising an IGBT (insulated gate bipolar transistor) region comprising an IGBT and a diode region comprising a diode, the IGBT region having in a top view a first area and the diode region having in the top view a second area, wherein the IGBT region comprises a plurality of first trenches comprising first trench electrodes and extending perpendicular to a first main surface of the semiconductor substrate, wherein the diode region comprises a plurality of second trenches having second trench electrodes and extending perpendicular to the first main surface of the semiconductor substrate, wherein the plurality of first trenches provides a first capacitance between the first trench electrodes and the semiconductor substrate in the IGBT region and the plurality of second trenches provides a second capacitance between the second trench electrodes and the semiconductor substrate in the diode region, wherein a capacitance density of the second capacitance per the second area is smaller than a capacitance density of the first capacitance per the first area.

Example 2

The power semiconductor device of example 1, wherein the capacitance density of the second capacitance per the second area is 1.5 times to 10 times less than the capacitance density of the first capacitance per the first area.

Example 3

The power semiconductor device of examples 1 or 2, wherein the plurality of first trenches extends to a first depth in the semiconductor substrate, wherein the plurality of second trenches extends to a second depth in the semiconductor substrate, and wherein the second depth is less than the first depth.

Example 4

The power semiconductor device of any of examples 1 through 3, wherein an insulating layer between the second trench electrodes and the semiconductor substrate is thicker than an insulating layer between the first trench electrodes and the semiconductor substrate.

Example 5

The power semiconductor device of any of examples 1 through 4, wherein a permittivity of an insulating layer between the second trench electrodes and the semiconductor substrate is smaller than a permittivity of an insulating layer between the first trench electrodes and the semiconductor substrate.

Example 6

The power semiconductor device of any of examples 1 through 5, further comprising: a plurality of first contact trenches extending perpendicular to the first main surface of the semiconductor substrate in the IGBT region; and a plurality of second contact trenches extending perpendicular to the first main surface of the semiconductor substrate in the diode region, wherein an average density of a side wall area of the second contact trenches between adjacent second trenches in the diode region is greater than an average density of a side wall area of the first contact trenches between adjacent first trenches in the IGBT region.

Example 7

The power semiconductor device of example 6, wherein at least two second contact trenches are disposed between adjacent second trenches in the diode region, and wherein a single first contact trench is disposed between adjacent first trenches in the IGBT region.

Example 8

The power semiconductor device of example 6, wherein at least four contact trenches are disposed between adjacent second trenches in the diode region, and wherein a single first contact trench is disposed between adjacent first trenches in the IGBT region.

Example 9

The power semiconductor device of any of examples 6 through 8, wherein a doping concentration of the semiconductor substrate at a sidewall of the plurality of second contact trenches is lower than a doping concentration of the semiconductor substrate at a bottom of the plurality of second contact trenches.

Example 10

The power semiconductor device of any of examples 1 through 9, further comprising: a plurality of first contact trenches extending perpendicular to the first main surface of the semiconductor substrate in the IGBT region; and a plurality of second contact trenches extending perpendicular to the first main surface of the semiconductor substrate in the diode region, wherein an average density of a side wall area of the second contact trenches per the second area is greater than an average density of a side wall area of the first contact trenches per the first area.

Example 11

The power semiconductor device of any of examples 1 through 10, further comprising: a plurality of first contact trenches extending perpendicular to the first main surface of the semiconductor substrate in the IGBT region; and a plurality of second contact trenches extending perpendicular to the first main surface of the semiconductor substrate in the diode region, wherein a single first contact trench is disposed between adjacent first trenches in the IGBT region, wherein a single second contact trench is disposed between adjacent second trenches in the diode region, wherein the second contact trenches have an average width which is greater than an average width of the first contact trenches.

Example 12

A power semiconductor device, comprising: a semiconductor substrate comprising an IGBT region having an IGBT and a diode region having a diode, wherein the IGBT region comprises a plurality of first trenches extending perpendicular to a first main surface of the semiconductor substrate, wherein the diode region comprises a plurality of second trenches extending perpendicular to the first main surface of the semiconductor substrate, wherein an average lateral spacing between adjacent ones of the second trenches is greater than an average lateral spacing between adjacent ones of the first trenches.

Example 13

The power semiconductor device of example 12, wherein the average lateral spacing between adjacent ones of the second trenches is 1.5 times to 30 times greater than the average lateral spacing between adjacent ones of the first trenches.

Example 14

The power semiconductor device of examples 12 or 13, wherein the average lateral spacing between adjacent ones of the second trenches is greater than 0.6 µm and less than 20 µm.

Example 15

The power semiconductor device of any of examples 12 through 14, further comprising: a plurality of first contact trenches extending into the first main surface of the semiconductor substrate in the IGBT region; and a plurality of second contact trenches extending into the first main surface of the semiconductor substrate in the diode region, wherein an average density of a side wall area of second contact trenches between adjacent second trenches per the second area is greater than an average density of a side wall area of first contact trenches between adjacent first trenches per the first area.

Example 16

The power semiconductor device of example 15, wherein at least two second contact trenches are disposed between adjacent second trenches in the diode region, and wherein a single first contact trench is disposed between adjacent first trenches in the IGBT region.

Example 17

The power semiconductor device of example 15, wherein at least four contact trenches are disposed between adjacent second trenches in the diode region, and wherein a single first contact trench is disposed between adjacent first trenches in the IGBT region.

Example 18

The power semiconductor device of any of examples 15 through 17, wherein a doping concentration of the semiconductor substrate at a side all of the plurality of second contact trenches is lower than a doping concentration of the semiconductor substrate at a bottom of the plurality of second contact trenches.

Example 19

The power semiconductor device of any of examples claim 12 through 18, further comprising: a plurality of first contact trenches extending perpendicular to the first main surface of the semiconductor substrate in the IGBT region; and a plurality of second contact trenches extending perpendicular to the first main surface of the semiconductor substrate in the diode region, wherein a single first contact trench is disposed between adjacent first trenches in the IGBT region, wherein a single second contact trench is disposed between adjacent second trenches in the diode region, wherein the second contact trenches have an average width which is greater than an average width of the first contact trenches.

Example 20

The power semiconductor device of any of examples claim 12 through 19, wherein each second trench is segmented into trench portions along a direction of a lengthwise extension of the plurality of second trenches, and wherein adjacent trench portions of the same second trench are separated from one another by a substrate area of the semiconductor substrate.

Example 21

The power semiconductor device of any of examples claim 12 through 20, further comprising a plurality of contact trenches extending into the first main surface of the semiconductor substrate in the diode region, wherein the contact trenches are connected at predefined locations by one or more crossing contact trenches extending in a direction perpendicular to a lengthwise extension of the contact trenches.

Example 22

A method of producing a power semiconductor device, the method comprising: forming an IGBT in an IGBT region of a semiconductor substrate, the IGBT region having in a top view a first area; and forming a diode in a diode region of the semiconductor substrate, the diode region having in the top view a second area, wherein forming the IGBT comprises forming a plurality of first trenches having first trench electrodes and extending perpendicular to a first main surface of the semiconductor substrate in the IGBT region, wherein forming the diode comprises forming a plurality of second trenches having second trench electrodes which extend perpendicular to the first main surface of the semiconductor substrate in the diode region, such that a capacitance density of a capacitance provided between the plurality of second trenches and the semiconductor substrate per the second area is less than a capacitance density of a capacitance provided between the plurality of first trenches and the semiconductor substrate per the first area.

Example 23

The method of example 22, wherein forming the plurality of second trenches comprises forming fewer second trenches per unit area in the diode region than there are first trenches per unit area in the IGBT region.

Example 24

The method of examples 22 or 23, wherein forming the plurality of second trenches comprises terminating the second trenches shallower in the semiconductor substrate than the first trenches.

Example 25

The method of any of examples 22 through 24, wherein forming the plurality of second trenches comprises spacing the second trenches further apart in the diode region than the first trenches are spaced apart in the IGBT region.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
   a semiconductor substrate comprising an IGBT (insulated gate bipolar transistor) region comprising an IGBT and a diode region comprising a diode, the IGBT region having in a top view a first area and the diode region having in the top view a second area,
   wherein the IGBT region comprises a plurality of first trenches comprising first trench electrodes and extending perpendicular to a first main surface of the semiconductor substrate,
   wherein the diode region comprises a plurality of second trenches having second trench electrodes and extending perpendicular to the first main surface of the semiconductor substrate,
   wherein the plurality of first trenches provides a first capacitance between the first trench electrodes and the semiconductor substrate in the IGBT region and the plurality of second trenches provides a second capacitance between the second trench electrodes and the semiconductor substrate in the diode region,
   wherein a capacitance density of the second capacitance per the second area is smaller than a capacitance density of the first capacitance per the first area.

2. The power semiconductor device of claim 1, wherein the capacitance density of the second capacitance per the second area is 1.5 times to 10 times less than the capacitance density of the first capacitance per the first area.

3. The power semiconductor device of claim 1, wherein the plurality of first trenches extends to a first depth in the semiconductor substrate, wherein the plurality of second trenches extends to a second depth in the semiconductor substrate, and wherein the second depth is less than the first depth.

4. The power semiconductor device of claim 1, wherein an insulating layer between the second trench electrodes and the semiconductor substrate is thicker than an insulating layer between the first trench electrodes and the semiconductor substrate.

5. The power semiconductor device of claim 1, wherein a permittivity of an insulating layer between the second trench electrodes and the semiconductor substrate is smaller than a permittivity of an insulating layer between the first trench electrodes and the semiconductor substrate.

6. The power semiconductor device of claim 1, further comprising:
   a plurality of first contact trenches extending perpendicular to the first main surface of the semiconductor substrate in the IGBT region; and
   a plurality of second contact trenches extending perpendicular to the first main surface of the semiconductor substrate in the diode region,
   wherein an average density of a side wall area of the second contact trenches between adjacent second trenches in the diode region is greater than an average density of a side wall area of the first contact trenches between adjacent first trenches in the IGBT region.

7. The power semiconductor device of claim 6, wherein at least two second contact trenches are disposed between adjacent second trenches in the diode region, and wherein a single first contact trench is disposed between adjacent first trenches in the IGBT region.

8. The power semiconductor device of claim 6, wherein at least four contact trenches are disposed between adjacent second trenches in the diode region, and wherein a single first contact trench is disposed between adjacent first trenches in the IGBT region.

9. The power semiconductor device of claim 6, wherein a doping concentration of the semiconductor substrate at a sidewall of the plurality of second contact trenches is lower than a doping concentration of the semiconductor substrate at a bottom of the plurality of second contact trenches.

10. The power semiconductor device of claim 1, further comprising:
a plurality of first contact trenches extending perpendicular to the first main surface of the semiconductor substrate in the IGBT region; and
a plurality of second contact trenches extending perpendicular to the first main surface of the semiconductor substrate in the diode region,
wherein an average density of a side wall area of the second contact trenches per the second area is greater than an average density of a side wall area of the first contact trenches per the first area.

11. The power semiconductor device of claim 1, further comprising:
a plurality of first contact trenches extending perpendicular to the first main surface of the semiconductor substrate in the IGBT region; and
a plurality of second contact trenches extending perpendicular to the first main surface of the semiconductor substrate in the diode region,
wherein a single first contact trench is disposed between adjacent first trenches in the IGBT region,
wherein a single second contact trench is disposed between adjacent second trenches in the diode region,
wherein the second contact trenches have an average width which is greater than an average width of the first contact trenches.

12. A power semiconductor device, comprising:
a semiconductor substrate comprising an IGBT region having an IGBT and a diode region having a diode,
wherein the IGBT region comprises a plurality of first trenches extending perpendicular to a first main surface of the semiconductor substrate,
wherein the diode region comprises a plurality of second trenches extending perpendicular to the first main surface of the semiconductor substrate,
wherein an average lateral spacing between adjacent ones of the second trenches is 1.5 times to 30 times greater than an average lateral spacing between adjacent ones of the first trenches.

13. The power semiconductor device of claim 12, wherein the average lateral spacing between adjacent ones of the second trenches is greater than 0.6 μm and less than 20 μm.

14. The power semiconductor device of claim 12, further comprising:
a plurality of first contact trenches extending into the first main surface of the semiconductor substrate in the IGBT region; and
a plurality of second contact trenches extending into the first main surface of the semiconductor substrate in the diode region,
wherein an average density of a side wall area of second contact trenches between adjacent second trenches per the second area is greater than an average density of a side wall area of first contact trenches between adjacent first trenches per the first area.

15. The power semiconductor device of claim 14, wherein at least two second contact trenches are disposed between adjacent second trenches in the diode region, and wherein a single first contact trench is disposed between adjacent first trenches in the IGBT region.

16. The power semiconductor device of claim 14, wherein at least four contact trenches are disposed between adjacent second trenches in the diode region, and wherein a single first contact trench is disposed between adjacent first trenches in the IGBT region.

17. The power semiconductor device of claim 14, wherein a doping concentration of the semiconductor substrate at a sidewall of the plurality of second contact trenches is lower than a doping concentration of the semiconductor substrate at a bottom of the plurality of second contact trenches.

18. The power semiconductor device of claim 12, further comprising:
a plurality of first contact trenches extending perpendicular to the first main surface of the semiconductor substrate in the IGBT region; and
a plurality of second contact trenches extending perpendicular to the first main surface of the semiconductor substrate in the diode region,
wherein a single first contact trench is disposed between adjacent first trenches in the IGBT region,
wherein a single second contact trench is disposed between adjacent second trenches in the diode region,
wherein the second contact trenches have an average width which is greater than an average width of the first contact trenches.

19. The power semiconductor device of claim 12, wherein each second trench is segmented into trench portions along a direction of a lengthwise extension of the plurality of second trenches, and wherein adjacent trench portions of the same second trench are separated from one another by a substrate area of the semiconductor substrate.

20. The power semiconductor device of claim 12, further comprising:
a plurality of contact trenches extending into the first main surface of the semiconductor substrate in the diode region,
wherein the contact trenches are connected at predefined locations by one or more crossing contact trenches extending in a direction perpendicular to a lengthwise extension of the contact trenches.

21. A method of producing a power semiconductor device, the method comprising:
forming an IGBT in an IGBT region of a semiconductor substrate, the IGBT region having in a top view a first area; and
forming a diode in a diode region of the semiconductor substrate, the diode region having in the top view a second area,
wherein forming the IGBT comprises forming a plurality of first trenches having first trench electrodes and extending perpendicular to a first main surface of the semiconductor substrate in the IGBT region,
wherein forming the diode comprises forming a plurality of second trenches having second trench electrodes which extend perpendicular to the first main surface of the semiconductor substrate in the diode region, such that a capacitance density of a capacitance provided between the plurality of second trenches and the semiconductor substrate per the second area is less than a capacitance density of a capacitance provided between the plurality of first trenches and the semiconductor substrate per the first area.

22. The method of claim 21, wherein forming the plurality of second trenches comprises forming fewer second trenches per unit area in the diode region than there are first trenches per unit area in the IGBT region.

23. The method of claim 21, wherein forming the plurality of second trenches comprises terminating the second trenches shallower in the semiconductor substrate than the first trenches.

24. The method of claim 21, wherein forming the plurality of second trenches comprises spacing the second trenches further apart in the diode region than the first trenches are spaced apart in the IGBT region.

25. A power semiconductor device, comprising:
a semiconductor substrate comprising an IGBT region having an IGBT and a diode region having a diode, the IGBT region comprising a plurality of first trenches extending perpendicular to a first main surface of the semiconductor substrate, the diode region comprising a plurality of second trenches extending perpendicular to the first main surface of the semiconductor substrate;
a plurality of first contact trenches extending into the first main surface of the semiconductor substrate in the IGBT region; and
a plurality of second contact trenches extending into the first main surface of the semiconductor substrate in the diode region,
wherein an average density of a side wall area of second contact trenches between adjacent second trenches per the second area is greater than an average density of a side wall area of first contact trenches between adjacent first trenches per the first area.

26. The power semiconductor device of claim 25, wherein at least two second contact trenches are disposed between adjacent second trenches in the diode region, and wherein a single first contact trench is disposed between adjacent first trenches in the IGBT region.

27. The power semiconductor device of claim 25, wherein at least four contact trenches are disposed between adjacent second trenches in the diode region, and wherein a single first contact trench is disposed between adjacent first trenches in the IGBT region.

28. The power semiconductor device of claim 25, wherein a doping concentration of the semiconductor substrate at a sidewall of the plurality of second contact trenches is lower than a doping concentration of the semiconductor substrate at a bottom of the plurality of second contact trenches.

29. A power semiconductor device, comprising:
a semiconductor substrate comprising an IGBT region having an IGBT and a diode region having a diode, the IGBT region comprising a plurality of first trenches extending perpendicular to a first main surface of the semiconductor substrate, the diode region comprising a plurality of second trenches extending perpendicular to the first main surface of the semiconductor substrate;
a plurality of first contact trenches extending perpendicular to the first main surface of the semiconductor substrate in the IGBT region; and
a plurality of second contact trenches extending perpendicular to the first main surface of the semiconductor substrate in the diode region,
wherein a single first contact trench is disposed between adjacent first trenches in the IGBT region,
wherein a single second contact trench is disposed between adjacent second trenches in the diode region,
wherein the second contact trenches have an average width which is greater than an average width of the first contact trenches.

* * * * *